United States Patent [19]

Katsura et al.

[11] Patent Number: 5,008,727
[45] Date of Patent: Apr. 16, 1991

[54] STANDARD CELL HAVING TEST PAD FOR PROBING AND SEMICONDUCTOR INTEGRATED CIRCUIT DEVICE CONTAINING THE STANDARD CELLS

[75] Inventors: Joji Katsura, Nishinomiya; Yoshiyuki Takagi, Osaka; Shigeru Watari, Nara, all of Japan

[73] Assignee: Matsushita Electric Industrial Co., Ltd., Kadoma, Japan

[21] Appl. No.: 299,686

[22] Filed: Jan. 23, 1989

[30] Foreign Application Priority Data

| Jan. 22, 1988 | [JP] | Japan | 63-12924 |
| May 16, 1988 | [JP] | Japan | 63-118522 |
| Jun. 21, 1988 | [JP] | Japan | 63-153234 |
| Oct. 14, 1988 | [JP] | Japan | 63-260045 |

[51] Int. Cl.$^5$ ............................................. H01L 27/02
[52] U.S. Cl. ........................................ 357/40; 357/45; 357/41; 357/68; 371/15.1; 371/22.6
[58] Field of Search ............... 371/15.1, 22.2, 22.5, 371/22.6; 324/73 R, 158 P, 72.5; 357/45, 40, 41, 45 M, 68

[56] References Cited

U.S. PATENT DOCUMENTS

| 4,413,271 | 11/1983 | Gontowski, Jr. et al. | 357/40 |
| 4,768,073 | 8/1988 | Adams | 357/40 X |
| 4,866,508 | 9/1989 | Eichelberger et al. | 357/45 X |
| 4,870,300 | 9/1989 | Nakaya et al. | 357/45 X |

FOREIGN PATENT DOCUMENTS

| 0257870 | 3/1988 | European Pat. Off. | 357/45 |
| 60-43840 | 3/1985 | Japan | 357/40 |
| 63-142847 | 6/1988 | Japan | 357/40 |

*Primary Examiner*—William Mintel
*Attorney, Agent, or Firm*—Wenderoth, Lind & Ponack

[57] ABSTRACT

A cell containing a test pad is defined as a standard cell, in the same fashion as a logic circuit, and is disposed and wired, together with logic circuit cells, in the internal circuit region excluding the input and output pad regions around the chip by a standard cell system. The cell containing the test pad possesses the pad region for feeding a reference potential in the cell, or the pad region capable of detecting a reference signal, or the layout pattern for expressing an arbitrary code for distinguishing the cell from other cells.

7 Claims, 5 Drawing Sheets

STANDARD CELL HAVING TEST PAD FOR PROBING AND SEMICONDUCTOR INTEGRATED CIRCUIT DEVICE CONTAINING THE STANDARD CELLS

BACKGROUND OF THE INVENTION

This invention relates to a structure and its method of a circuit for detecting the potential of a node on a circuit in a semiconductor integrated circuit device.

Conventionally, as the method for detecting the potential of an arbitrary node on a circuit of a semiconductor integrated circuit device, a test pad was mounted on a desired node on the layout, and it was directly contacted with the detection probe. Or, as a non-contact potential detecting method, the method of detecting by using a strobo SEM or an EB (electron beam) tester is known, but as the chip layout pattern becomes finer, the detecting sensitivity or resolution is lowered, or as the logic circuit is integrated and becomes complicated, the detection of the potential has become difficult. In this case, too, a test pad is required on a desired node position on the circuit.

For example, a conventional composition of signal detecting pad is shown in FIGS. 10(a)–10(b). Element 131 is a wiring pattern of a signal wire in the chip, and elements 132 and 133 are pads for detecting signals such as potentials. As shown in the drawings, the size of the pads installed for detecting the potential of a signal wire is often larger than the signal wiring pattern as the pattern becomes finer so as to easily realize mechanical probing by a direct contact, or non-contact probing by an EB tester.

FIG. 10(a) shows an example in which the layer of the detecting pad and the layer of the signal wiring are identical, and FIG. 10(b) shows an example in which the layer of the detecting pad and the layer of the signal wiring are different, and the two layers are connected by a contact.

Hitherto, however, this test pad was not defined as a logic cell. Accordingly, in the circuit block composed by automatic disposition and wiring of cells by a computer conforming to a net list on the basis of a circuit diagram, test pads could not be present. Therefore, by making up a desired circuit block and modifying the layout, test pads were additionally inserted into desired positions. It hence caused a significant layout change, and induced logic errors and layout errors in the process, which was a great disturbance for the development of chips.

The pad installed for detecting potentials is useful when its area is larger if used in a mechanical probing of a direct contact. However, when using an EB tester which is a non-contact probing, by only merely increasing the size of the signal detecting pad, the desired potentials and signals cannot be sufficiently detected, and the following problems were noted. First, by the charge-up phenomenon on the chip surface by EB irradiation, the signal waveform is distorted. Secondly, the relative potential of the detected signal waveform can be accurately measured, but it is difficult to obtain the absolute value of the potential of the signal waveform.

The pad to be installed for detection of signals such as potentials can be used whether in mechanical probing of direct contact, or in non-contact probing such as an EB tester. However, since the node position of the signal to be detected in particular is at an arbitrary position on the layout, it is extremely difficult to search the node position and probe. The job efficiency was very poor because of moving and searching of position for probing, and complicated operation of the equipment for such moving. Or, if the signal waveform to be detected could be obtained, it was extremely difficult to know how much the signal waveform was delayed with respect to the clock signal as the reference for the waveform of the chip, and what the phase relationship therebetween was.

When, moreover, the signal detecting test pad is laid out within the circuit block, if there are a plurality of test pads and the layout states around the test pads are similar, it is difficult to judge visually which test pad is connected to which specific node.

SUMMARY OF THE INVENTION

This invention is defined as a logic circuit cell containing a test pad, and by automatic disposition and wiring by a standard cell system, a test pad for the detection of a potential or other signal, or a test circuit containing such a pad can be set on an arbitrary node on a circuit in a semiconductor integrated circuit device, and the design of the cell called the test cell on the logic circuit diagram is realized.

By disposing and wiring this test cell together with the logic circuit cell by a standard system with the aid of a computer, a layout design with a much higher job efficiency than that of the prior art is possible. Furthermore, the invention presents a very effective means for the detection of a node potential on a desired circuit in a semicondutor integrated circuit device to be realized either by the direct contact by a probe or a non-contact analyzing method such as a strobe SEM and an EB tester.

This invention, in a semiconductor integrated circuit device, realizes the disposition and wiring of a cell containing a test pad for the detection of a potential, together with a logic circuit cell by a standard cell system in an internal circuit region, excluding the input and output pad area around the chip.

This test pad or the test circuit containing the test pad is handled as a cell that can be defined on a circuit diagram. Here, the cell containing the test pad is called a test cell. By designing the circuit by containing the test cell together with the logic circuit cell, the net list of the circuit diagram is delivered, and the test cell is disposed and wired, together with the logic cell, by the standard cell system. In this manner, the test cell is also automatically disposed and wired by the computer at an arbitrary position in the internal circuit region of the chip.

The invention also discloses a structure in which a second pad region provided with a reference potential is disposed adjacently to a first pad region for signal detection installed at an arbitrary position in a chip.

When measuring the signal waveform by using a signal detecting pad by an EB tester or the like, the charge-up phenomenon of the chip surface occurs as the time passes due to the scanning of the electron beam. The electric charge accumulated on the chip surface by this charge-up is released from the second pad region provided with a reference potential in the structure of this invention, being adjacent to the first pad region for signal detection. If the reference potential of the second pad region is set at the supply voltage, the charge-up phenomenon of the chip is significantly suppressed. In the signal waveform measurement, by setting the potential of the second pad region provided with the reference potential of the invention at the supply potential or a ground potential, the absolute value of the potential of the signal waveform obtained by using the EB tester from the signal detecting pad can be accurately calibrated and obtained from the signal waveform of the reference potential.

DETAILED DESCRIPTION OF THE INVENTION

Figure 1A:
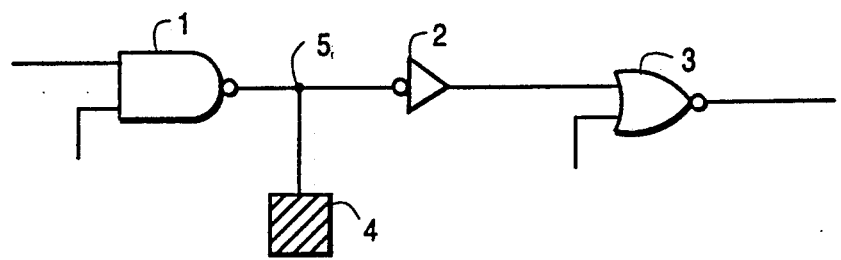
FIG. 1(a) is a logic circuit diagram used for explaining a first embodiment of the present invention.
Figure 1B:
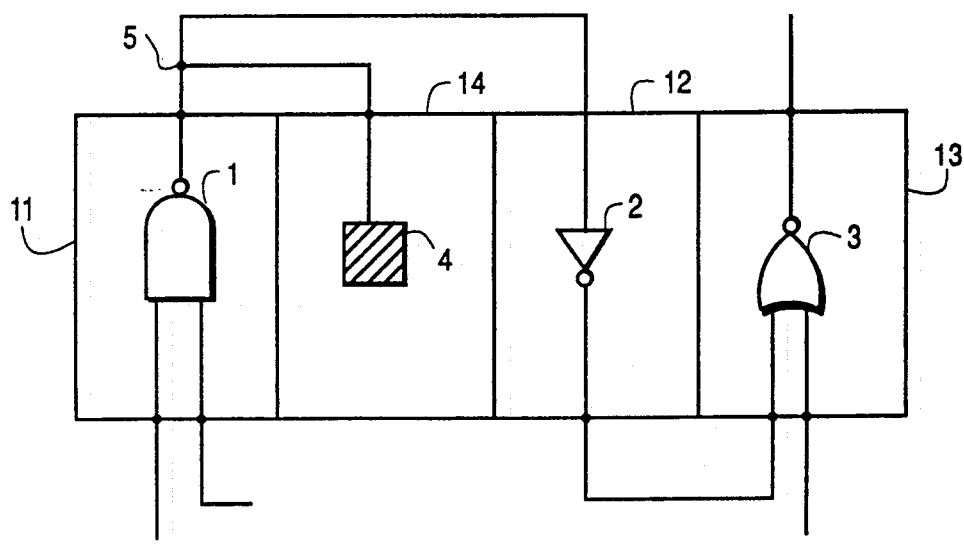
FIG. 1(b) is a layout diagram prepared by the standard cell system from the net list of the same logic circuit diagram.

Referring now to FIGS. 1(a)-1(b), a first embodiment of this invention is described below. FIG. 1(a) is a logic circuit diagram in accordance with the first embodiment, in which elements 1 to 3 are logic gates; element 4 is a test pad of the present invention expressed on a logic circuit diagram, and element 5 is a test node whose potential is to be detected. In this way, by handling the test pad or the test circuit containing the test pad as one logic circuit cell, the cells may be defined as the node on the circuit to be tested and its test circuit. This cell is called a test cell for convenience sake. As the method for describing a circuit, the net list method is known. This is to describe the mutual connection of the cells, regarding the logic gate as one cell. The method of laying out by the computer by disposing and connecting the cells in a specific algorithm, using the net list as an input, is called the standard cell system.

Since the test cell of this invention is a kind of circuit cell, and since it can be defined by the net list, the disposition and wiring by the standard cell system may be realized.

FIG. 1(b) shows a layout drawing prepared by the standard cell system by the net list based on the logic circuit diagram in FIG. 1(a). Elements 1 to 5 are logic gates which correspond to elements 1 to 5 in FIG. 1(a), and cells 11 to 14 denote the cells as the layout corresponding to the logic gate and test pad 4, and the layout pattern in the cell is not described herein. That is, this is a layout drawing showing the cell disposition state corresponding to each logic gate after disposition and wiring by the standard cell system on the basis of the net list.

This invention, in a semiconductor integrated circuit device, realizes the disposition and wiring of a cell containing a test pad for the detection of a potential, together with a logic circuit cell by a standard cell system in an internal circuit region, excluding the input and output pad areas around the chip.

Figure 2:
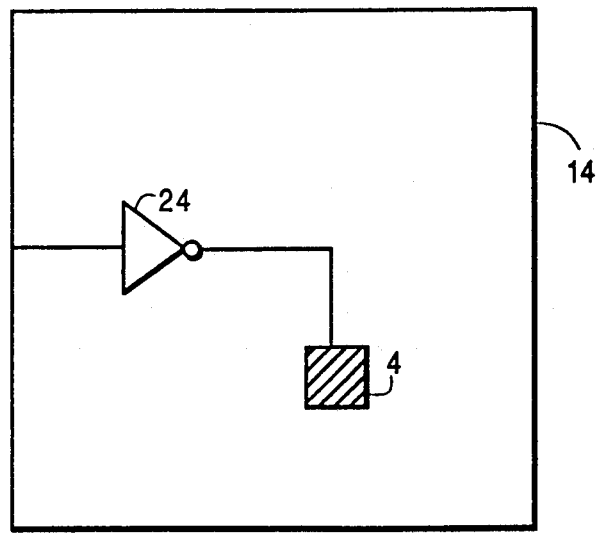
FIG. 2 is a logic circuit diagram showing the test cell possessing a test circuit aside from the test pad used for explaining a second embodiment of the present invention.

FIG. 2 is a logic circuit diagram showing the structure of a test cell in a second embodiment of the present invention. The inside of the cell 14 is supposed to show a circuit without describing the layout pattern. The test cell 14 is composed of a test pad 4, and an inverter 24 as a test circuit. Test circuits other than the test pad 4 may be composed of other logic gates and transistors, instead of the inverter 24. Besides, a plurality of test pads may be disposed in this test cell, and it is evident that this invention is not limited to a single test pad.

Figure 3:
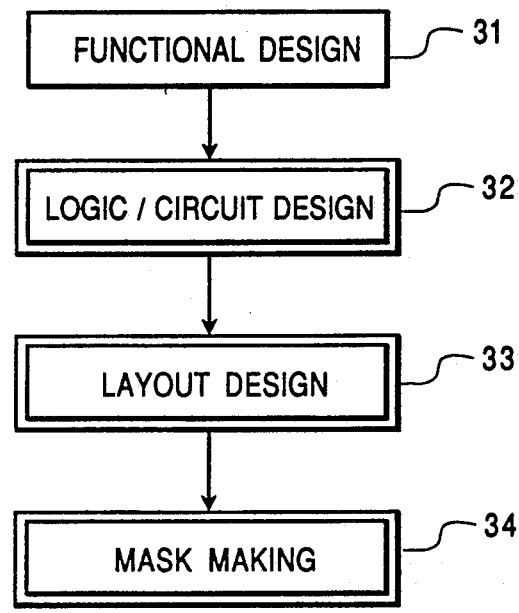
FIG. 3 is a design flow chart using a test cell of this invention.

FIG. 3 shows a design flow chart in which the test cell of the invention is used. The designing stages for designing chips, such as VLSI circuits, consist of stage 31 of functional design stage 32 of logic and circuit design, stage 33 of layout design and finally 34 of chip mask fabrication. The concept of the test pad conventionally present only in the layout design 33 stage is defined in this invention as a cell that can be handled as a logic circuit cell similar to a logic gate, which makes it possible to realize the design of the test cell on the logic circuit diagram in the logic and circuit design stage 32. Accordingly, a desired position on a circuit can be set in the logic/circuit design stage 32, and the net list designed and completed at this level is used in the automatic disposition and wiring by the standard cell system, which has notably improved the layout work relating to the test pad in the layout design stage 33.

Figure 4A:
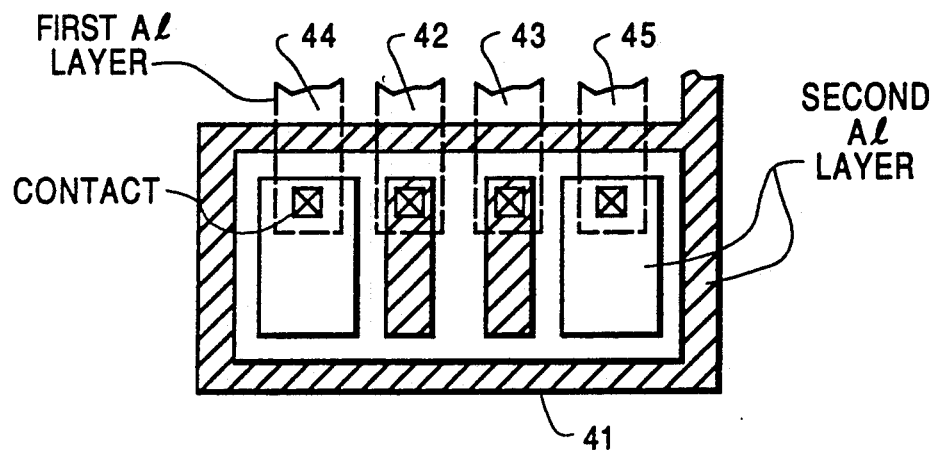
FIGS. 4(a)-4(b) show layout drawings used for explaining a third embodiment of the present invention, FIG. 4(a) being a layout drawing expressing the signal detecting test pad region and FIG. 4(b) showing a measurement waveform as a result of signal detection by using an EB tester using the test pad shown in FIG. 4(a)
Figure 4B:
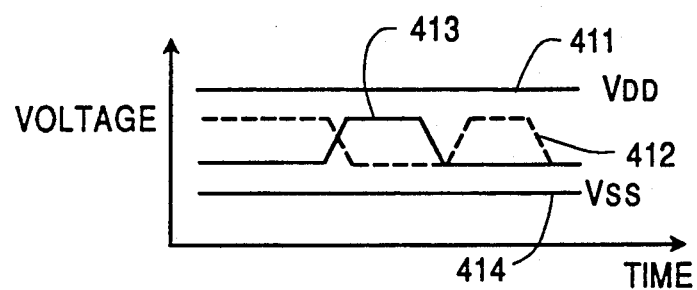

A third embodiment of a signal detecting pad according to this invention is explained by referring to FIGS. 4(a)-4(b).

FIG. 4(a) is a layout drawing showing the signal detecting pad region. Elements 41, 42, and 43 are layout patterns in the second pad region in the invention provided with a reference potential, and specifically element 41 is composed of a second Al layout, and elements 42 and 43 are composed of layout patterns consisting of a first Al layout and a second Al layer by way of a contact. Elements 44 and 45 are layout patterns for signal detecting pads of the present invention connected in order to detect the signal of a desired node, being composed of a first Al layer and a second Al layer through a contact. The layout of 41 is designed in a structure which is supplied with a supply voltage as a reference potential and surrounds signal detecting pads 44 and 45. This structure prevents charge-up due to electrons accumulated on the chip surface when detecting a signal by an EB tester. Besides, elements 42 and 43 are provided with reference potentials, being respectively a ground potential and a supply potential.

FIG. 4(b) shows a measurement waveform as a result of a signal detection by using an EB tester using a signal detecting pad of FIG. 4(a). Element 411 is a supply voltage waveform denoting the measurement waveforms of 41 and 43 in FIG. 4(a), element 412 and 413 are detected waveforms of signal detecting pads 44 and 45, and element 414 is a ground potential waveform, showing the measured waveform of 42 in FIG. 4(a). As shown in the diagram, the absolute voltage values of the signal potential waveforms 412 and 413 obtained at the signal detecting pads 44 and 45 can be accurately calibrated from the potential waveforms 411 and 414 in the pad region for supplying a reference potential, and strict numeral values can be obtained.

Figure 5:
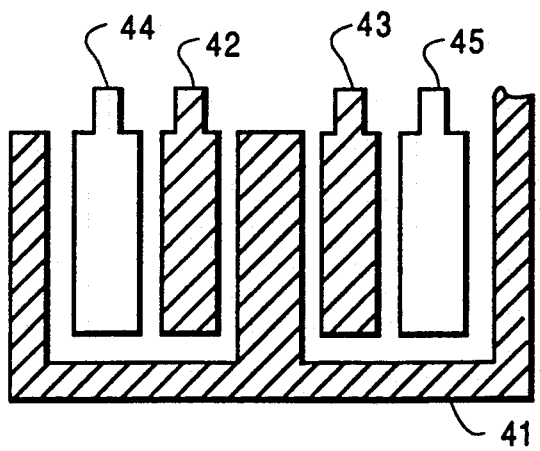
FIG. 5 is a layout drawing showing a test pad in a fourth embodiment of the present invention.

FIG. 5 is a layout drawing expressing a signal detecting pad of a fourth embodiment of the present invention. The same parts as those shown in FIG. 4(a) are identified with the same reference numbers and are not explained herein. In the drawing, elements 41, 42, 43 are pad regions provided with reference potentials, and elements 44 and 45 are layout patterns showing the signal detecting pad regions. The potential at the pad region 41 provided with reference potential is the supply potential, and its layout pattern has a structure of surrounding the signal detecting pads, 44 and 45 with a partial opening. In this constitution, it is known that its layout pattern can be realized by only one level of a second Al layer. In a fashion which is different from this example, needless to say, it is also possible to realize such a pattern by a first Al layer. The pad region 41 adjacent to the signal detecting pads 44 and 45 has a role for preventing charge-up of the chip surface by an EB scanning in the EB tester, and elements 42 and 43 can be used in the calibration of the absolute potential of the signal waveform obtained from the signal detecting pads 44 and 45 provided with a ground potential and supply potential as the reference potentials.

As the wiring material of the layout pattern described in the third and fourth embodiments of the invention, first Al layer and second Al layer are not limitative, but polysilicon, silicide and other wiring materials may be used. Besides, the shape, structure and relative configuration of the signal detecting pad regions and pad regions provided with reference potential are not particularly limited. The reference potential to be provided is not limited to the supply potential and ground potential alone, but any other specific set potential may be applied, as far as at least the potential of the pad region provided with one reference potential is higher than the ground potential.

Figure 6A:
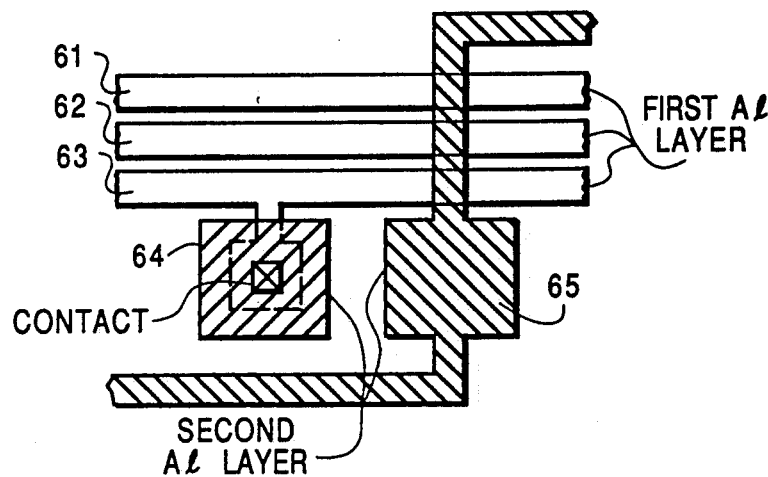
FIG. 6(a) is a layout drawing showing a test pad region and FIG. (6) is a waveform diagram used for explaining a fifth embodiment of the present invention.
Figure 6B:
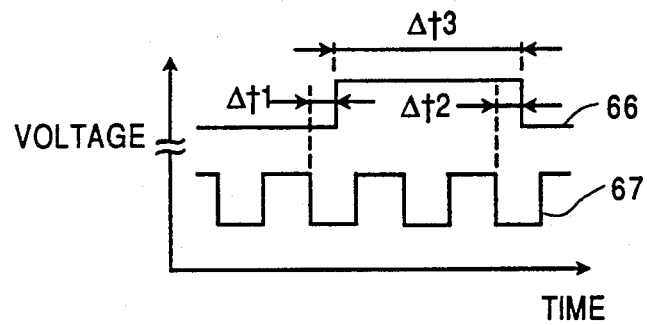

A fifth embodiment of the signal detecting pad of this invention is explained by referring to FIGS. 6(a)-6(b). FIG. 6(a) is a layout drawing showing the signal detecting pad region Al layer. Elements 61, 62, and 63 are first wiring of the layout pattern of a certain signal wire; element 64 is a signal waveform detecting pad region of signal wire 3, and element 65 is a pad region of a second Al layer provided with a reference signal. As shown in FIG. 6(a), it is possible to analyze the signal waveform very effectively by installing a pad region provided with a clock as reference signal adjacent to the signal pad region 64.

FIG. 6(b) shows the results of observation of a signal waveform 66 observed from the signal detecting pad, and a clock waveform 67 as the reference signal relating to that signal. The ordinate axis represents the voltage and the abscissa axis denotes the time. The detected signal waveform is known to rise after a delay of $\Delta t_1$ with respect to the fall of the reference clock, and fall after a delay of $\Delta t_2$ with respect to the fall of the reference clock two clocks later. Moreover, when the accurate values of $\Delta t_1$ and $\Delta t_2$ are known, it is possible to accurately detect the period $\Delta t_3$ of the "H" (high) state of the detected signal waveform 66. Thus, since the delay amount from the reference signal and the phase relationship can be accurately detected, it provides an effective means for seeking the cause of a problem when checking the function of a circuit operation or in the event of a failure.

In FIG. 6(a), Al is used in the wiring of signal wire, and the second layer Al is used in the pattern on the pad region, but these wiring materials and their layers are not particularly limited as is clear from the description herein, and the same holds true with the shape and structure of the pad region.

Figure 7:
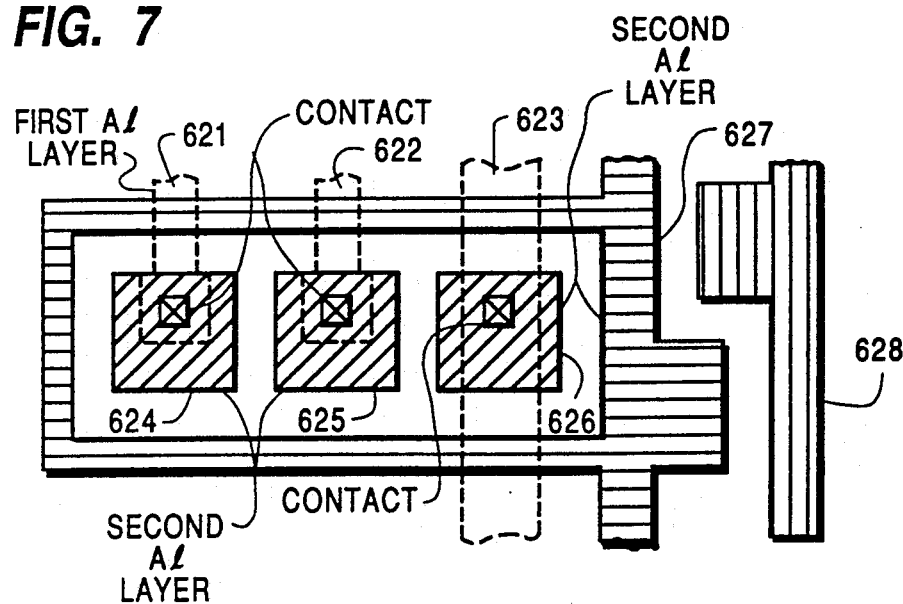
FIG. 7 is a layout drawing of a test pad used for explaining a sixth embodiment of the present invention.

FIG. 7 shows an embodiment of a signal detecting pad according to the present invention. This is a layout drawing for explaining the sixth embodiment. Elements 621 and 622 are wiring patterns for connecting the signal wire to be detected and the pad region; element 623 is a wiring pattern provided with a clock as a reference signal related to the signal to be detected; elements 624 and 625 are pad regions of the signal to be detected; element 626 is a pad region supplied with a reference signal, and elements 627 and 628 are pad regions provided with reference voltages. By disposing the pad region provided with a reference signal as shown in the drawing adjacent to the pad regions 624 and 625 connected to the node to be detected, it is possible to accurately detect the signal waveform delay or phase relationship between signals of the pad regions 624 and 625 of the signal to be detected using the clock waveform as the reference. In the sixth embodiment, in the structure of enclosing the pad region of the signal to be detected and the pad region for detecting the reference signal, pad regions 627 and 628 for reference potential supply are disposed adjacent to them. As a result, it is possible to measure the absolute potential of the signal waveform to be detected, or suppress the charge-up on the surface when using an EB tester. Similar to the first embodiment, the wiring material of the layout pattern and layer are also not limited in this embodiment, and the shape, structure and configuration of the pad regions for detection and for the reference signal supply are not particularly defined.

Figure 8:
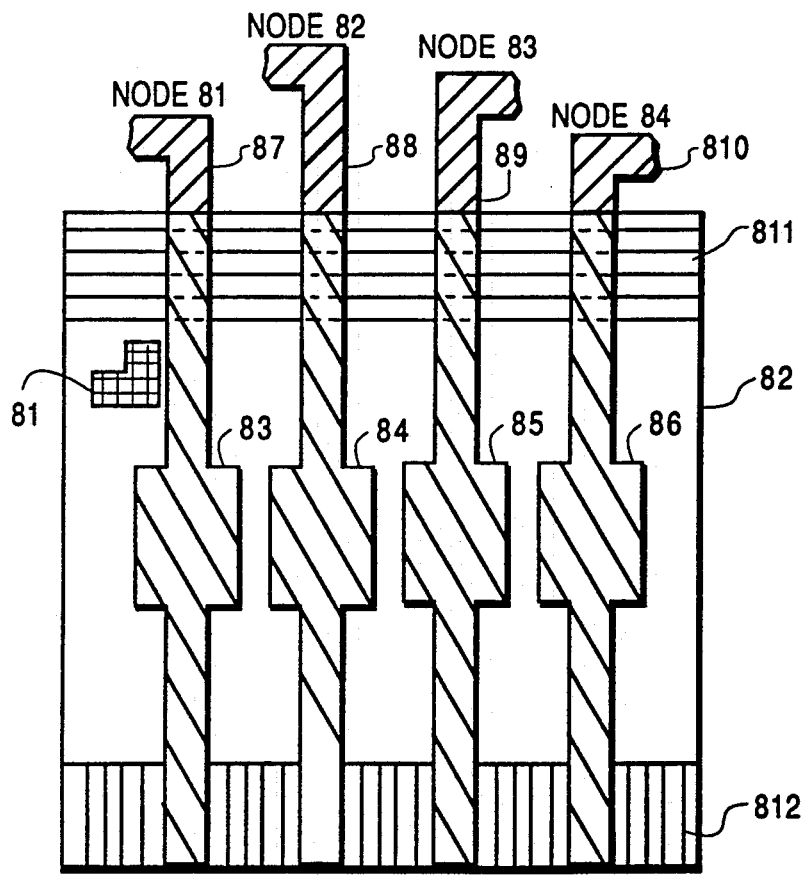
FIG. 8 is a layout drawing of a test pad cell used for explaining a seventh embodiment of the present invention.

A seventh embodiment of a signal detecting pad cell of this invention is shown in FIG. 8. This is a layout drawing of a signal detecting pad cell. Element 81 is a pattern for distinguishing the cell disposition state, and element 82 shows the cell disposition state, and in actual chip visual inspection, its outer frame is not observed. Elements 83, 84, 85 and 86 are layout patterns of the signal detecting pads; elements 87, 88, 89, and 810 are wiring regions to the nodes 81, 82, 83, and 84 and are connected to the respective pads, and elements 811 and 812 are the layout patterns of the power supply and groundwires. As shown in FIG. 8, the state of the disposed and wired cells can be discriminated by the layout pattern 81. That is, basically, in the cell, the discriminating pattern is placed in the upper left part. As a result, the connecting relationship with the external node with respect to plural pads in the cell is a 4-bit composition comprising nodes 81, 82, 83, 84 sequentially from the upper left end. Therefore, by the presence of this layout pattern 81, the cell disposition state can be easily identified. For example, when 81 is at the upper right position, the cells are inverted laterally, and when it is at the lower left position, they are inverted vertically, and the nodes to be connected are 81, 82, 83, 84 sequentially from the left end. Thus, by the layout pattern 81, it is possible to measure the signal waveform of a desired node easily while observing over the chip during the signal detection by an EB tester, etc. In this embodiment, fundamentally, the cell disposition state distinguishing pattern 81 is provided in the upper left position. Needless to say, however, its position may be also at the lower left position, upper right position or lower right position, upper right position or lower right position. It is hence possible to clearly understand the vertical relationship or inverted relationship of the cells. As for the pattern shape of 81, there is no particular limitation, and if it is at its location, the shape convenient for design may be freely determined. As the connecting point with the pad in the cell corresponding to the node for signal detection, the pin number of the cell may be easily determined visually.

Figure 9:
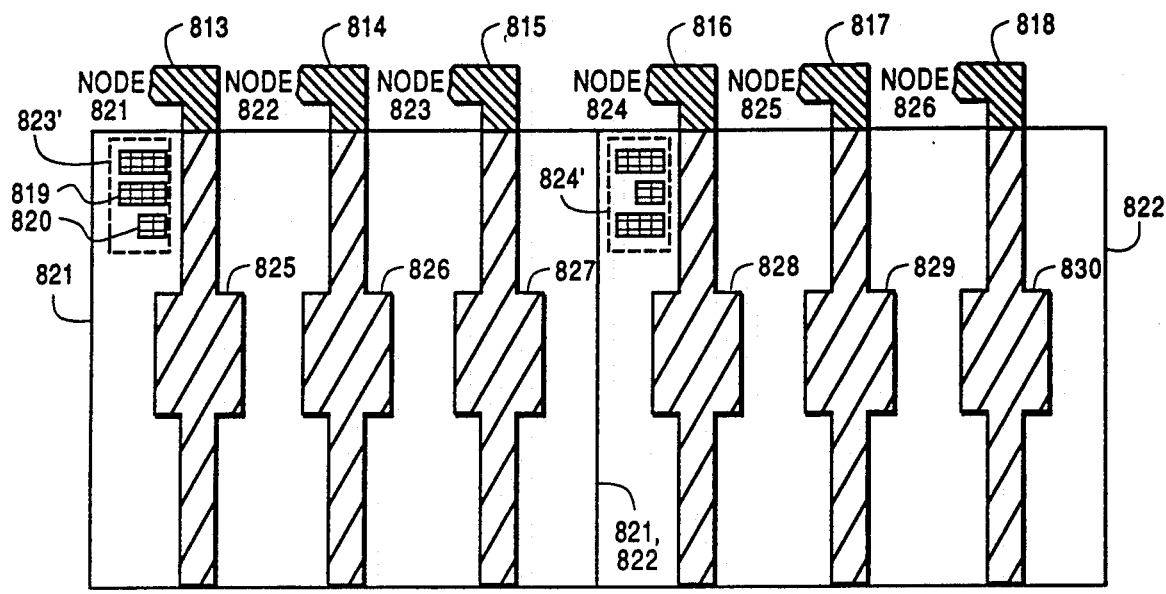
FIG. 9 is a layout drawing showing a test pad cell used for explaining an eighth embodiment of the present invention.
Figure 10A:
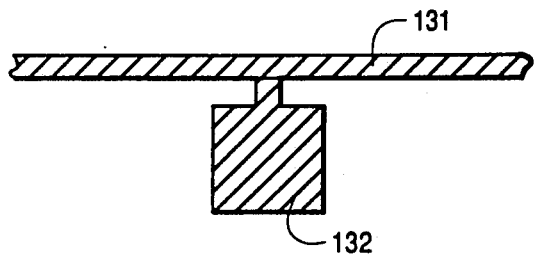
FIGS. 10(a)-10(b) are layout drawings showing the structure of a test pad as a conventional example used for explaining this invention.
Figure 10B:
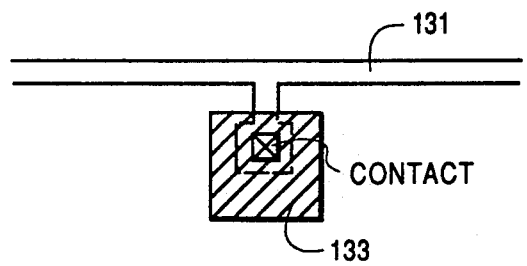

An eighth embodiment of a signal detecting pad cell of this invention is shown in FIG. 9. This is a layout drawing in which cells are mutually adjacent to each other. Elements 813, 814, 815, 816, 817 and 818 are wiring regions of nodes 821, 822, 823, 824, 825, and 826 respectively and are connected to the pads, and elements 821 and 822 show the state of disposition and wiring of these cells, and in actual visual inspection of chip, the outer frame of these cells is not observed. Elements 825 to 830 are layout patterns of signal detecting pads, and elements 823' and 824' are discriminating layout patterns possessed by each because the cell names of cells 82' and 822 of this invention are different. Elements 819 and 820 denote the long pattern and short pattern for composing the discriminating layout pattern, and their shape is not particularly specified. These discriminating layout patterns 823' and 824' are basically located in the upper left part of each cell. As a result, the vertical, lateral, and face-back disposition state of the cell can be simultaneously judged. As shown in the drawing, when the pattern shape of the pads in the cell is in identical structure, only the mutually different points as the cells as observed on the chip are the discriminating patterns 823' and 824'. What is meant by the pattern of 823' is long, long and short patterns from the top, which correspond to 1, 1, 0 of 3 bits, (1, 1, 0), which denotes a numeral 6, and similarly the pattern 824' represents a numeral 5. In this way, each cell is registered in the 6th position and 5th position as the signal detecting pad cells. Thus, the cells can be mutually distinguished from each other, and by only observing on the chip, which pin of which cell is connected to which node of the circuit in the chip can be determined.

Therefore, in the layout patter, if many pad cells similar in structure are disposed and wired adjacent to each other, the node connected to a cell can be clearly identified by setting the discriminating layout pattern. Furthermore, for the purpose of proving a desired node to be detected on the circuit, moving and searching of the location, and job and operation for such purpose can be greatly enhanced, and high speed chip evaluation and analysis may be realized.

The structure of the discriminating patterns in the seventh and eighth embodiments is not particularly limited in the pattern shape, direction, and number of patterns as far as the required functions are satisfied. The same holds true with their positions in the cell.

On the other hand, in this embodiment, the layout structure of the pattern is realized by one layer of wiring, but this is not limited to one layer.

We claim:

1. In a standard cell comprising a plurality of different types of standard cells, a circuit cell containing at least one test pad for probing comprising one of said plurality of standard cells.

2. In a standard cell system comprising a plurality of different types of standard cells, a circuit cell comprising one of said standard cells, said circuit cell comprising:

at least one test pad for probing disposed in said cell; and at least one reference voltage pad to which a reference voltage is supplied, said at least one reference voltage pad being disposed adjacent to said at least one test pad.

3. In a standard cell system comprising a plurality of different types of standard cells, a circuit cell comprising one of said standard cells, said circuit cell comprising:

at least one test pad for probing disposed in said cell; and at least one reference signal pad to which a reference signal is supplied, said at least one reference signal pad being disposed adjacent to said at least one test pad.

4. A cell as recited in claim 3, wherein said reference signal comprises a clock signal.

5. In a standard cell system comprising a plurality of different types of standard cells, a circuit cell comprising one of said standard cells, said circuit cell comprising:

at least one test pad for probing disposed in said cell; and at least one pattern having a distinctive shape for discriminating a cell disposition state.

6. A semiconductor integrated circuit device in which a plurality of standard cells are disposed and wired:

wherein at least one standard cell selected from among said plurality of standard cells has at least one test pad for probing.

7. A semiconductor integrated circuit device as recited in claim 6:

wherein said at least one selected standard cell having at least one test pad for probing is disposed and wired in a region excluding input and output pads used for making connections external to the device.

* * * * *